US006354241B1

(12) United States Patent
Tanaka et al.

(10) Patent No.: US 6,354,241 B1
(45) Date of Patent: Mar. 12, 2002

(54) HEATED ELECTROSTATIC PARTICLE TRAP FOR IN-SITU VACUUM LINE CLEANING OF A SUBSTRATED PROCESSING

(75) Inventors: Tsutomu Tanaka, Santa Clara; Chau Nguyen, San Jose; Hari Ponnekanti, Santa Clara; Kevin Fairbairn, Saratoga; Sébastien Raoux, San Francisco; Mark Fodor, Los Gatos, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/354,925

(22) Filed: Jul. 15, 1999

(51) Int. Cl.⁷ .............................................. C23C 16/00
(52) U.S. Cl. ................... 118/723 E; 118/715
(58) Field of Search ............................ 96/136; 55/307, 55/309, 284, 315–318, 291; 118/723 E, 715

(56) References Cited

U.S. PATENT DOCUMENTS

| | | | |
|---|---|---|---|
| 4,657,738 A | 4/1987 | Kanter et al. | 422/186.04 |
| 4,735,633 A | 4/1988 | Chiu | 588/247 |
| 4,816,046 A | 3/1989 | Maeba et al. | 96/221 |
| 5,000,113 A | 3/1991 | Wang et al. | 118/723 |
| 5,141,714 A | 8/1992 | Obuchi et al. | 422/174 |
| 5,211,729 A | 5/1993 | Sherman | 55/308 |
| 5,323,013 A | 6/1994 | Kelly et al. | 250/522.1 |
| 5,417,826 A | 5/1995 | Blalock | 204/176 |
| 5,451,378 A | 9/1995 | Russell et al. | 422/186.3 |
| 5,453,125 A | 9/1995 | Krogh | 118/723 MR |
| 5,453,305 A | 9/1995 | Lee | 427/562 |

FOREIGN PATENT DOCUMENTS

| | | | |
|---|---|---|---|
| CA | 1282732 A | 9/1991 | B01J/19/08 |
| DE | 4319118 A1 | 12/1994 | A62D/3/00 |
| DE | 19601 436 A1 | 7/1997 | C23F/4/00 |

(List continued on next page.)

OTHER PUBLICATIONS

Danielson et al., "Use DryScrub to Improve Hot Wall Nitride Equipment Reliability," *Product Application Report*, pp. 1–6.

Hayward, W.H., "Introduction to Radio Frequency Design," *Library of Congress Cataloging in Publication Data* pp. 135–137, (1982).

(List continued on next page.)

*Primary Examiner*—Felisa Hiteshew
(74) *Attorney, Agent, or Firm*—Townsend & Townsend & Crew

(57) ABSTRACT

An apparatus and method for preventing particulate matter and residue build-up within a vacuum exhaust line of a semiconductor-processing device. The apparatus includes a vessel chamber having an inlet, an outlet and a fluid conduit between the two that fluidly couples the outlet with the inlet. The fluid conduit includes first and second collection sections. The first collection section includes a first plurality of electrodes aligned parallel to a first plane and the second collection section includes a second plurality of electrodes aligned parallel to a second plane that is substantially perpendicular to the first plane. The electrodes are connected to a voltage differential to form an electrostatic particle collector that traps electrically charged particles and particulate matter flowing through the fluid conduit. Particles are collected on the electrodes within the fluid conduit during substrate processing operations such as CVD deposition steps. Then, during a chamber clean operation, unreacted etchant gases used to clean the substrate processing chamber are exhausted through the foreline and into the apparatus of the present invention where they react with the collected particles and powder to convert the solid material into gaseous matter that can be pumped through the foreline without damaging the vacuum pump or other processing equipment.

25 Claims, 6 Drawing Sheets

FOREIGN PATENT DOCUMENTS

| | | | | |
|---|---|---|---|---|
| EP | 0 158 823 A2 | 10/1985 | ............ | B01D/53/54 |
| EP | 0 176 295 | 4/1986 | ............ | B01D/53/00 |
| EP | 0289 858 A1 | 4/1988 | ............ | B01D/46/24 |
| EP | 0 296 720 A2 A3 | 12/1988 | ............ | B01D/53/32 |
| EP | 0781 599 A2 | 2/1997 | ............ | B01J/19/08 |
| EP | 0 767 254 A1 | 4/1997 | ............ | C23C/16/44 |
| EP | 0781 599 A3 | 10/1997 | ............ | B01J/19/08 |
| JP | 51-129868 | 11/1976 | | |
| JP | 52-78176 | 7/1977 | | |
| JP | 58-101722 | 6/1983 | ............ | B01D/45/04 |
| JP | 59-181619 | 10/1984 | ......... | H01L/21/302 |
| JP | 60-234313 | 11/1985 | ......... | H01L/21/205 |
| JP | 63-28869 | 2/1988 | ............ | C23C/16/44 |
| JP | 01 288 355 A | 11/1989 | ............ | B01J/19/00 |
| JP | 02 125876 A | 5/1990 | ............ | C23C/16/44 |
| JP | 4-136175 | 5/1992 | ............ | C23C/16/44 |
| JP | 05 202474 A | 8/1993 | ............ | C23C/16/00 |
| JP | 09 010 544 A | 1/1997 | ............ | B01D/53/32 |
| WO | WO 80/01363 | 7/1980 | ............. | B08B/7/00 |

OTHER PUBLICATIONS

Lieberman et al., "Principles of Plasma Discharges and Materials Processing," *Library of Congress Cataloging in Publication Data*, pp. 404–410, (1994).

Mocella et al., "Options for Environmentally Impacted Perfluorinated Gases Used in Plasma Processing," $10^{th}$ Symposium Plasma Etching, pp. 192–200 (1994).

Mocella et al., "Etch Process Characterization Using Neural Network Methodology: A Case Study," *SPIE Process Module Metrology, Control and Clustering*, 1594:232–242 (1991).

Mohindra et al., "Abatement of Perfluorocompounds ($PFC_s$) in a Microwave Tubular Reator Using O2 As an Additive Gas," *Department of Chemical Engineering*, MIT, pp. 1–59.

Singer et al., "Pre–pump Scrubbers Simplify Maintenance and Improve Safety," Smiconductor International, pp. 1–3.

HEATED ELECTROSTATIC PARTICLE TRAP FOR IN-SITU VACUUM LINE CLEANING OF A SUBSTRATED PROCESSING

BACKGROUND OF THE INVENTION

The present invention relates generally to the field of semiconductor processing equipment and more specifically to a method and apparatus for eliminating contaminants and residues from inside a vacuum exhaust line connected to a processing chamber and to a method and apparatus for reducing perfluorocompound (PFC) gas emissions from a processing chamber.

During chemical vapor deposition (CVD) processing, deposition gases are released inside a processing chamber to form a thin film layer on the surface of a substrate being processed. Unwanted deposition on areas such as the walls of the processing chamber also occurs during such CVD processes. Because the residence time in the chamber of individual molecules in these deposition gases is relatively short, however, only a small portion of the molecules released into the chamber are consumed in the deposition process and deposited on either the wafer or chamber walls.

The unconsumed gas molecules are pumped out of the chamber along with partially reacted compounds and reaction byproducts through a vacuum exhaust line that is commonly referred to as the "foreline." Many of the compounds in this exhausted gas are still in highly reactive states and/or contain residues or particulate matter that can form unwanted deposits in the foreline. Given time, this deposition build-up of powdery residue and/or particulate matter presents a problem. First, the matter is often a pyrophoric substance that may present problems when the vacuum seal is broken and the foreline is exposed to ambient conditions during standard, periodic cleaning operations. Second, if enough of the deposition material builds-up in the foreline, the foreline and/or its associated vacuum pump may clog if it is not appropriately cleaned. Even when periodically cleaned, matter build-up interferes with normal operation of the vacuum pump and can drastically shorten the useful life of the pump. Also, the solid matter may backwash from the foreline into the processing chamber and contaminate processing steps adversely effecting wafer yield.

To avoid these problems, the inside surface of the foreline is regularly cleaned to remove the deposited material. This procedure is performed during a standard chamber clean operation that is employed to remove unwanted deposition material from the chamber walls and similar areas of the processing chamber. Common chamber cleaning techniques include the use of an etching gas, such as fluorine, to remove the deposited material from the chamber walls and other areas. The etching gas is introduced into the chamber and a plasma is formed so that the etching gas reacts with and removes the deposited material from the chamber walls. Such cleaning procedures are commonly performed between deposition steps for every wafer or every N wafers.

Removal of deposition material from chamber walls is relatively straightforward in that the plasma is created within the chamber in an area proximate to the deposited material. Removal of deposition material from the foreline is more difficult because the foreline is downstream from the processing chamber. In a fixed time period, most points within the processing chamber come in contact with more of the etchant fluorine atoms than do points within the foreline. Thus, in a fixed time period, the chamber may be adequately cleaned by the clean process while residue and similar deposits remain in the foreline.

To attempt to adequately clean the foreline, the duration of the clean operation must be increased. Increasing the length of the clean operation, however, is undesirable because it adversely effects wafer throughput. Also, such residue build-up can be cleaned only to the extent that reactants from the clean step are exhausted into the foreline in a state that they may react with the residue in the foreline. In some systems and applications, the lifetime of the exhausted reactants is not sufficient to reach the end or even middle portions of the foreline. In these systems and applications, residue build-up is even more of a concern. Accordingly, there is a need for an apparatus for efficiently and thoroughly cleaning the foreline in a semiconductor processing system and a method of doing the same.

One approach that has been employed to clean the foreline relies on a scrubbing system that uses plasma enhanced CVD techniques to extract reactive components in the exhaust gas as film deposits on electrode surfaces. The scrubbing system is designed to maximize the removal of reactants as a solid film and uses large surface area spiral electrodes. The spiral electrodes are contained within a removable canister that is positioned near the end of the foreline between the blower pump and mechanical pump. After a sufficient amount of solid waste has built up on the electrodes, the canisters may be removed for disposal and replacement.

Problems exist in this prior art method in that the system relies on the large surface area of the electrodes to provide an area for deposited solid matter to collect. To accommodate the large surface area of the electrodes, the system is necessarily large and bulky. Furthermore, extra expenses are incurred in the operation of this prior art scrubber system since the removable canister is a disposable product that must be replaced and properly disposed. Also, the scrubbing system is located downstream from a beginning portion of the vacuum foreline and thus does not ensure removal of powdery material or particulate matter that builds-up in this portion of the line.

Other approaches to remove particle build-up have relied on creation of a plasma within a particle collection chamber. Basically, these approaches use electrostatic, thermophoretic and/or gravitational forces to collect particles and other solid matter within a collection chamber. The collected particulate matter is then converted to gaseous products that may be pumped through the vacuum line when etchant gases, such as fluorine, are exhausted from the chamber through the vacuum line during a clean step. The conversion process in these devices includes the creation of a plasma by one of several different methods including the use of microwave power, capacitively-coupled electrodes or an induction field. Examples of devices using these approaches are described in Published European Patent Application Nos. 96306536.2, entitled "METHOD AND APPARATUS FOR CLEANING A VACUUM LINE IN A CVD SYSTEM"; 97308660.6, entitled "PARALLEL PLATE APPARATUS FOR IN-SITU VACUUM LINE CLEANING FOR SUBSTRATE PROCESSING EQUIPMENT"; 96309542.7, entitled "METHOD AND APPARATUS FOR REDUCING PERFLUOROCOMPOUND GASES FROM SUBSTRATE PROCESSING EQUIPMENT EMISSIONS" and 97118103.7, entitled "MICROWAVE APPARATUS FOR IN-SITU VACUUM LINE CLEANING FOR SUBSTRATE PROCESSING EQUIPMENT" each of which are assigned to Applied Materials, the assignee of the present invention.

Despite the development of the devices described in the three Applied Material's patent applications described above, other improved methods and devices for cleaning substrate chamber forelines are desirable.

SUMMARY OF THE INVENTION

The present invention provides a new and improved method and device for cleaning substrate chamber forelines. The invention solves many of the problems of some prior art devices described above and provides an improved apparatus that substantially prevents particulate matter and other residual material from building up in an exhaust line. Powder residue and other particulate matter that would otherwise collect in the vacuum line during deposition steps is trapped in a collection chamber where it is held until a subsequent clean step. Fluorine, or other etchant radicals introduced into the chamber in the clean step make their way through the exhaust line into the collection chamber where they react with the trapped particles converting them into gaseous products that can be readily pumped through the vacuum line. The invention also provides a method for preventing the formation of and ensuring removal of such particulate material from within vacuum line.

The present invention provides improved particle control without the need to generate a separate plasma within the particle collector thus saving operational and construction costs as compared to devices that rely on generation of a plasma within the device. Also, the present invention achieves these results while being process transparent. That is, in preferred embodiments, operation of the present invention takes no additional processing time to either prevent particulate matter from building up within the foreline or to clean the built-up particulate matter from the collection chamber.

In one embodiment of the apparatus of the present invention, the apparatus includes a vessel chamber having an inlet, an outlet and a fluid conduit therebetween that fluidly-couples the outlet with the inlet. The fluid conduit includes first and second collection sections. The first collection section includes a first plurality of electrodes aligned parallel to a first plane and the second collection section includes a first gas passageway defining a path of flow in a first direction for gases passing through the fluid conduit and a second gas passageway defining a flow path in a second direction different than the first direction. The electrodes in the first section are connected to a voltage differential to form an electrostatic particle collector that traps electrically charged particles and particulate matter flowing through the fluid conduit.

Particles are collected within the fluid conduit during substrate processing operations such as CVD deposition steps. Then, during a chamber clean operation, unreacted etchant gases used to clean the substrate processing chamber are exhausted through the foreline and into the apparatus of the present invention where they react with the collected particles and/or powder to convert the solid material into gaseous matter. The gaseous matter can be pumped through the foreline without damaging the vacuum pump or other processing equipment.

In a preferred embodiment of the apparatus of the present invention, the second collection section includes a second plurality of electrodes, connected to the voltage differential, that define the first and second gas passages and that are aligned parallel to a second plane that intersects the first plane. In a more preferred embodiment, the second plane is substantially perpendicular to the first plane and the first direction is substantially opposite in direction to the second direction.

In another preferred embodiment, at least some of the first and/or second pluralities of electrodes are connected to a heater that heats the trapped particles and facilitates break-down of the particles into gaseous products during subsequent clean cycles.

In still other preferred embodiments, the first plurality of electrodes includes outer and inner electrodes extending toward each other in an interdigitated manner. The outer electrodes fan out from an exterior wall of the fluid conduit and the inner electrodes fan out from an interior shaft extending through a center portion of the apparatus. In this embodiment, the second plurality of electrodes can also include outer and inner electrodes extending toward each other in an interdigitated manner with the outer electrodes fanning out from an exterior wall and the inner electrodes extending out from an interior shaft of the apparatus.

These and other embodiments of the present invention, as well as its advantages and features are described in more detail in conjunction with the text below and attached figures.

DESCRIPTION OF THE SPECIFIC EMBODIMENTS

I. Exemplary Semiconductor Processing Chamber

Figure 1:
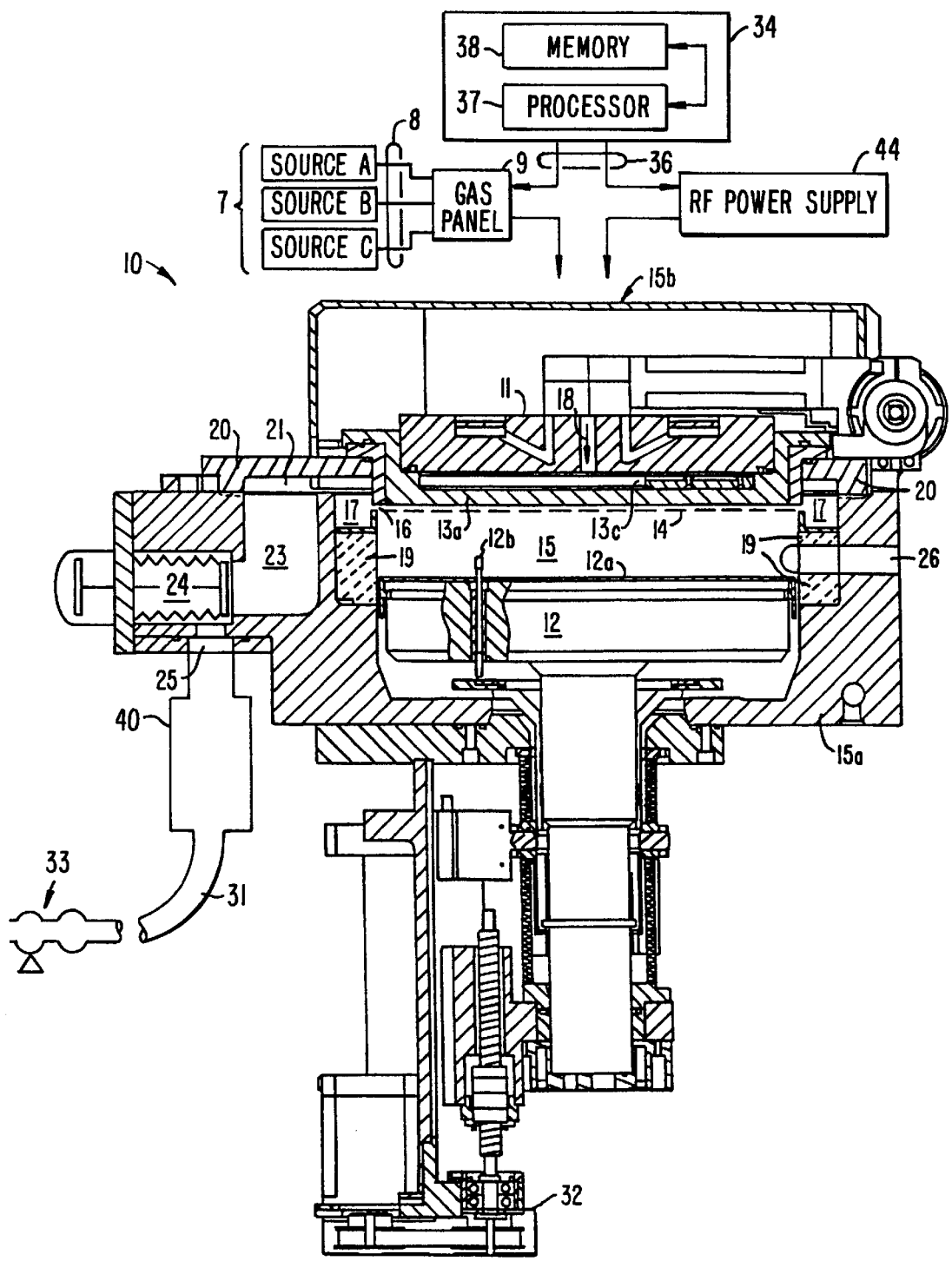
FIG. 1 illustrates one embodiment of a simplified chemical vapor deposition apparatus to which the apparatus of the present invention may be attached.

The apparatus of the present invention can be used in conjunction with a variety of different semiconductor processing devices. One suitable device, a chemical vapor deposition machine, is shown in FIG. 1 which is a cross-sectional view of a simplified, parallel plate chemical vapor deposition system 10. CVD system 10 includes a vacuum or processing chamber 15 that has a chamber wall 15a and chamber lid assembly 15b. Chamber 15 includes a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be moved controllably between a lower loading/off-loading position (depicted in FIG. 1) and an upper processing position (indicated by dashed line 14 in FIG. 1), which is closely adjacent to manifold 11. A centerboard (not shown) includes sensors for providing information on the position of the wafers.

Deposition and carrier gases are introduced into chamber 15 through perforated holes (not shown) of a conventional flat, circular gas distribution or faceplate 13a. More specifically, deposition process gases flow into the chamber through the inlet manifold 11 (indicated by arrow 18 through a conventional perforated blocker plate (in area 136) and then through holes in gas distribution faceplate 13a.

Before reaching the manifold, deposition and carrier gases are input from gas sources 7 through gas supply lines 8 into a mixing system 9 where they are combined and then sent to manifold 11. Generally, the supply line for each process gas is connected to (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 can supply either single or mixed frequency RF power that, for example, may supply power at a high RF frequency (RF1) of 13.56 MHz and at a low RF frequency (RF2) of 360 KHz to enhance the decomposition of reactive species introduced into the vacuum chamber 15. In a thermal deposition process, RF power supply 44 would not be utilized, and the process gas mixture thermally reacts to deposit the desired films on the surface of the semiconductor wafer supported on pedestal 12, which is resistively heated to provide thermal energy for the reaction.

During a plasma-enhanced deposition process, the plasma heats the entire process chamber 10, including the walls of the chamber body 15a surrounding the exhaust passageway 23 and the shut-off valve 24. When the plasma is not turned on or during a thermal deposition process, a hot liquid is circulated through the walls 15a of the process chamber to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump 33. Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to an external vacuum pump 33 through a foreline 31.

The wafer support platter of the pedestal 12 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 is assigned to Applied Materials, Inc., the assignee of the present invention, and is hereby incorporated by reference in its entirety.

A lift mechanism and motor 32 raises and lowers the heater pedestal assembly 12 and its wafer lift pins 12b as wafers are transferred into and out of the body of the chamber by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 over control lines 36, of which only some are shown. Controller 34 relies on feedback from optical and mechanical sensors to determine the position of some movable mechanical assemblies such as the pedestal lift mechanism which are moved by appropriate motors under the control of controller 34.

In a preferred embodiment, the system controller includes a hard disk drive (memory 38), a floppy disk drive and a processor 37. System controller 34 controls all of the activities of the CVD machine. The system controller executes system control software, which is a computer program stored in a computer-readable medium such as a memory 38.

The above reactor description is mainly for illustrative purposes, and the present invention may be used with other CVD equipment such as electron cyclotron resonance (ECR) plasma CVD devices, induction coupled RF high density plasma CVD devices, or the like. The present invention may also be used with thermal CVD devices, plasma etching devices, physical vapor deposition devices and other substrate processing devices. The apparatus of the present invention and the method for preventing deposition build-up within a vacuum line is not limited to any specific semiconductor processing apparatus or to any specific deposition or etching process or method.

II. Exemplary Semiconductor Processing Operations

During semiconductor processing operations such as chemical vapor deposition processes carried out by CVD reactor 10, a variety of gaseous waste products and contaminants are exhausted from vacuum chamber 15 into vacuum line 31. Depending on the particular operation being performed, these exhaust products may include particulate matter such as partially reacted products and byproducts that leaves a residue or similar powdery material within the vacuum line as it is exhausted through the line. For example, during the deposition of a silicon nitride film using silane ($SiH_4$), nitrogen ($N_2$) and ammonia ($NH_3$) as precursors, residue in the form of a brown powder composed of $Si_xN_yH_z$ and elemental silicon has been observed in the foreline. It is believed that this residue build-up is from half-reacted byproducts of the reaction of $SiH_4+N_2+NH_3$. Similar residues are also formed during the deposition of silicon nitride layers using other precursor gases or liquids such as disilane (S$_2$H$_6$) or organic sources. Residue build-up may also occur during the deposition of oxynitride films and silicon oxide films among other layers and may also occur during plasma etching and other process steps.

The present invention prevents build-up of such residues and particulate matter by trapping the particulate matter in a collection chamber. Then, later when etchant gases are exhausted through the vacuum line during a subsequent chamber clean operation, the etchant gases react with the deposited material to form gaseous products and byproducts that may be pumped through the vacuum line without forming deposits or condensing within the line.

The present invention may be used to keep the vacuum line clean for a variety of substrate processing operations that produce such particulate matter. It should be noted, however, that some substrate processing operations are "dirtier" than others. That is, some operations generate byproducts that contain more particulate matter and powder than other operations. While the present invention may find uses in cleaning the vacuum line of a chamber used for any substrate processing operation that produces any level of particulate byproducts, the present invention is most useful in keeping the vacuum line clean of a chamber used in such dirty processes. The above-described CVD silicon nitride film deposited from precursors of silane, nitrogen and ammonia is known to be one such particularly "dirty" process. Processes that produce very low levels of particulate matter may not require the use of equipment dedicated to keeping exhaust lines free of particle build-up.

III. Exemplary Embodiments of the Present Invention

As shown in FIG. 1, a particle collector 40 according to the present invention is positioned downstream from the exhaust gas source—processing chamber 15. Particle collector 40 may either connect to or replace a portion of the vacuum foreline. Preferably, it is positioned as close as possible to exhaust outlet 25 of chamber 15 in order to maximize the amount of powder and other particulate matter that is collected within the collection chamber and minimize the amount that is deposited within other areas of the vacuum line.

Figure 2A:
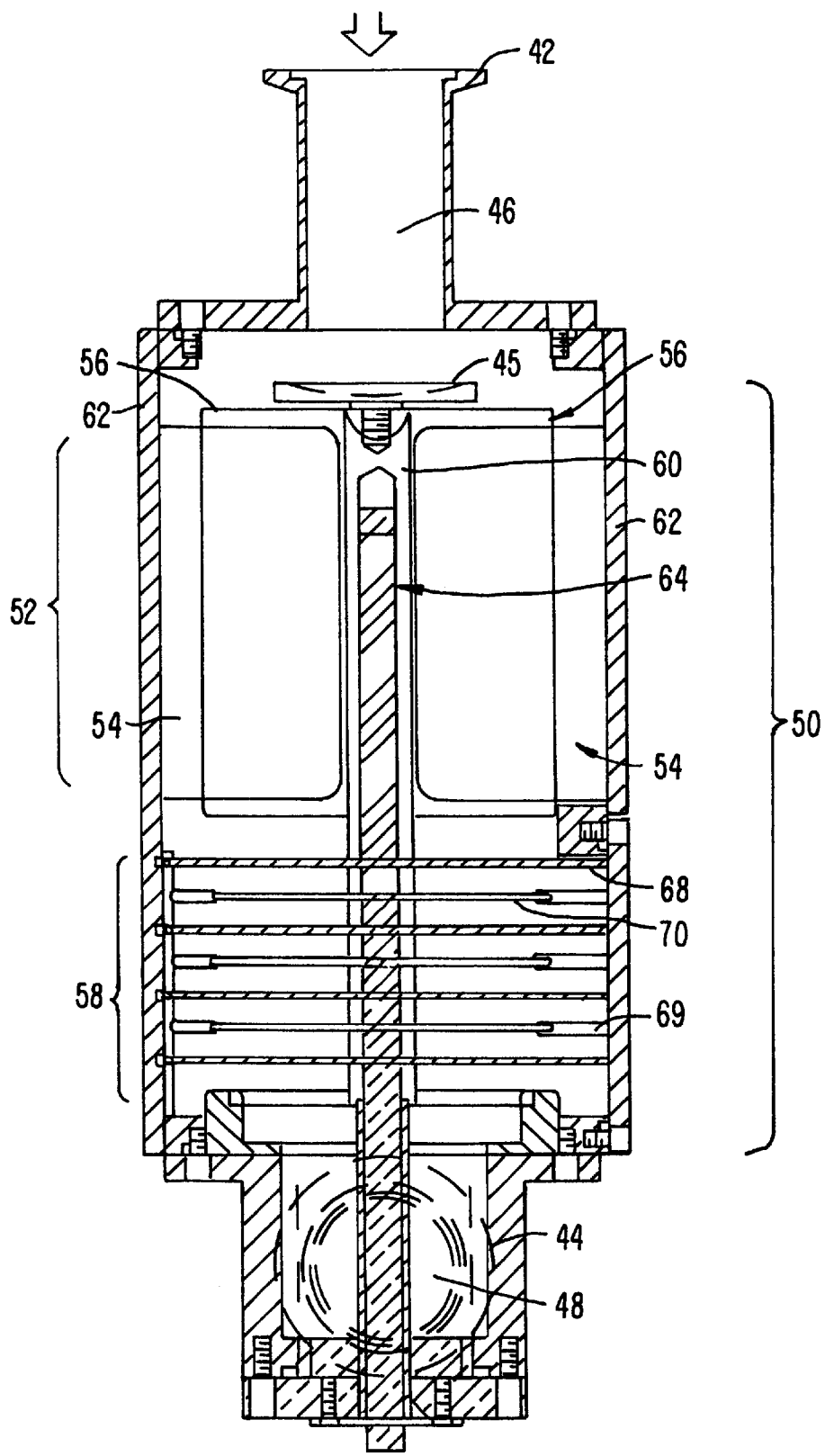
FIG. 2A is a side cross-sectional view of one embodiment of the vacuum line cleaning apparatus of the present invention.
Figure 2B:
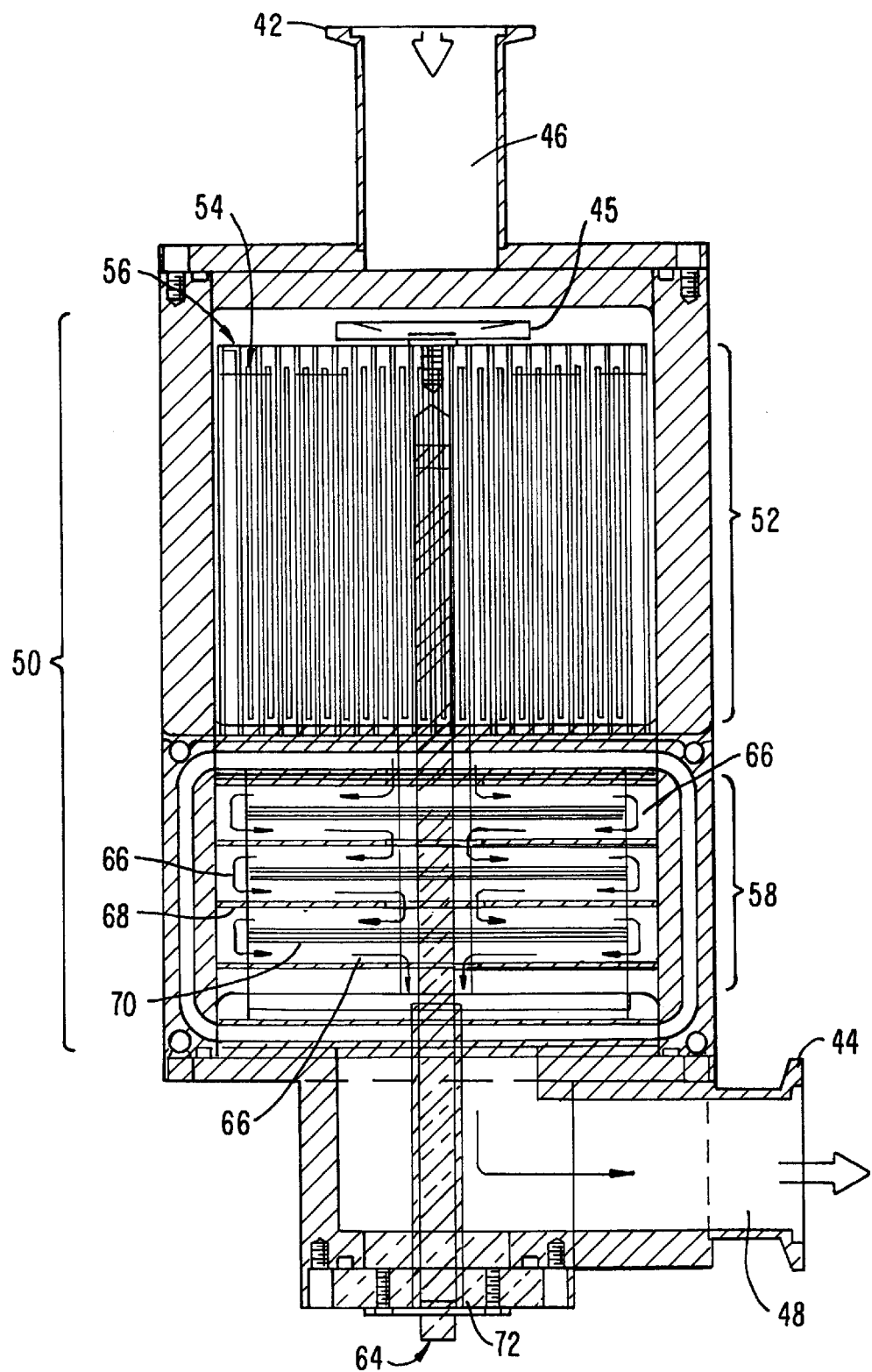
FIG. 2B is a side cross-section view of the apparatus shown in FIG. 2A rotated 90 from the view of FIG. 2A.

FIGS. 2A–2D show a preferred embodiment of the particle collector of the present invention. FIGS. 2A and 2B show side, cross-sectional views of the apparatus, with FIG. 2B showing the same view as FIG. 2A rotated 90°. As shown in FIGS. 2A and 2B, particle collector 40 connects to exhaust outlet 25 via flange 42 and connects to vacuum line 31 via flange 44. Between flanges 42 and 44 is particle collection chamber 50. Particle collection chamber 50 includes two separate collection sections: a parallel electrode array section 52 that includes a parallel electrode array of anode electrodes 54 and cathode electrodes 56; and a labyrinthine section 58 that incorporates a labyrinth structure (also referred to as a serpentine structure) designed to trap particles by centrifugal force.

Figure 2C:
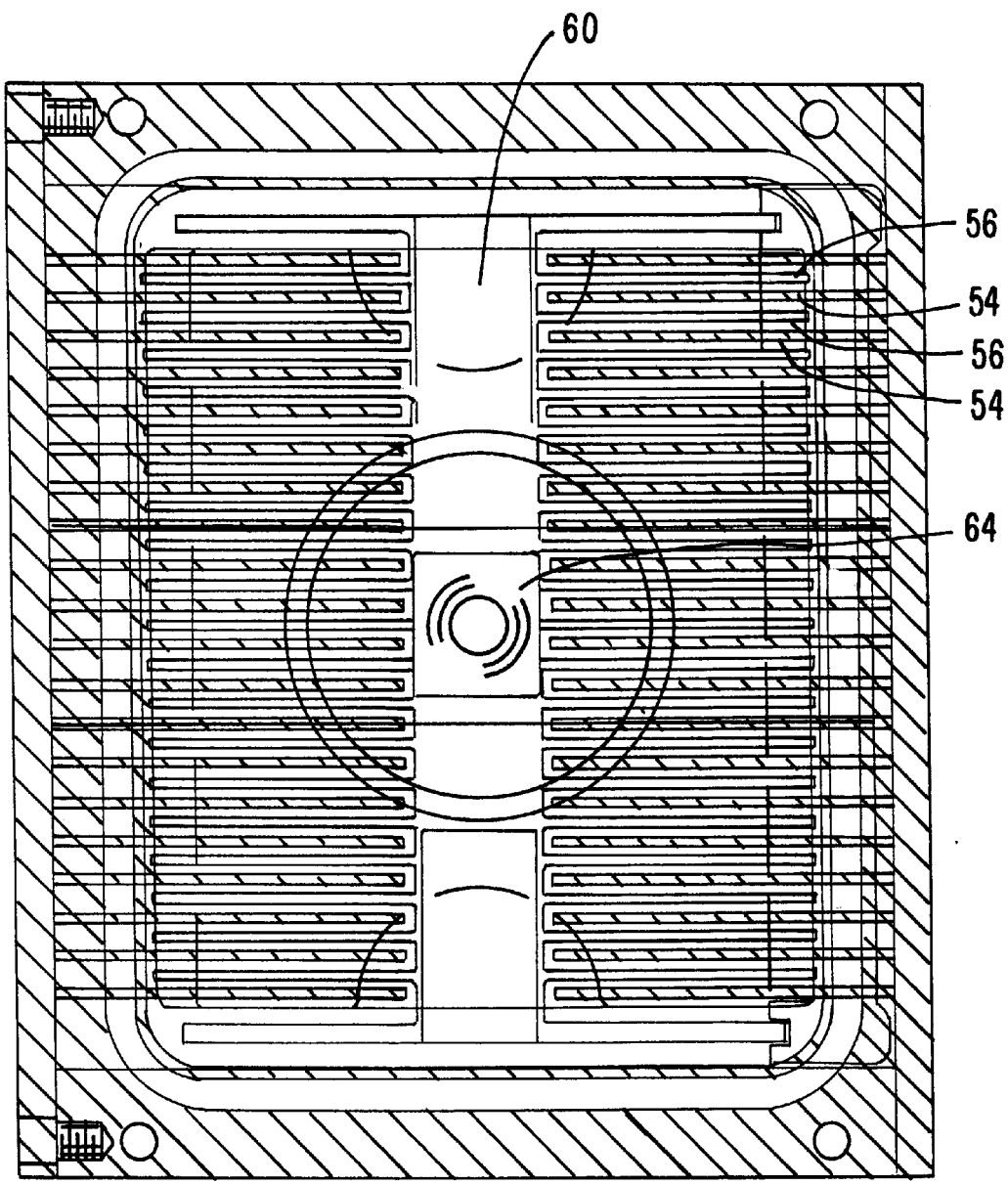
FIG. 2C is a top cross-sectional view of the apparatus shown in FIG. 2A.
Figure 2D:
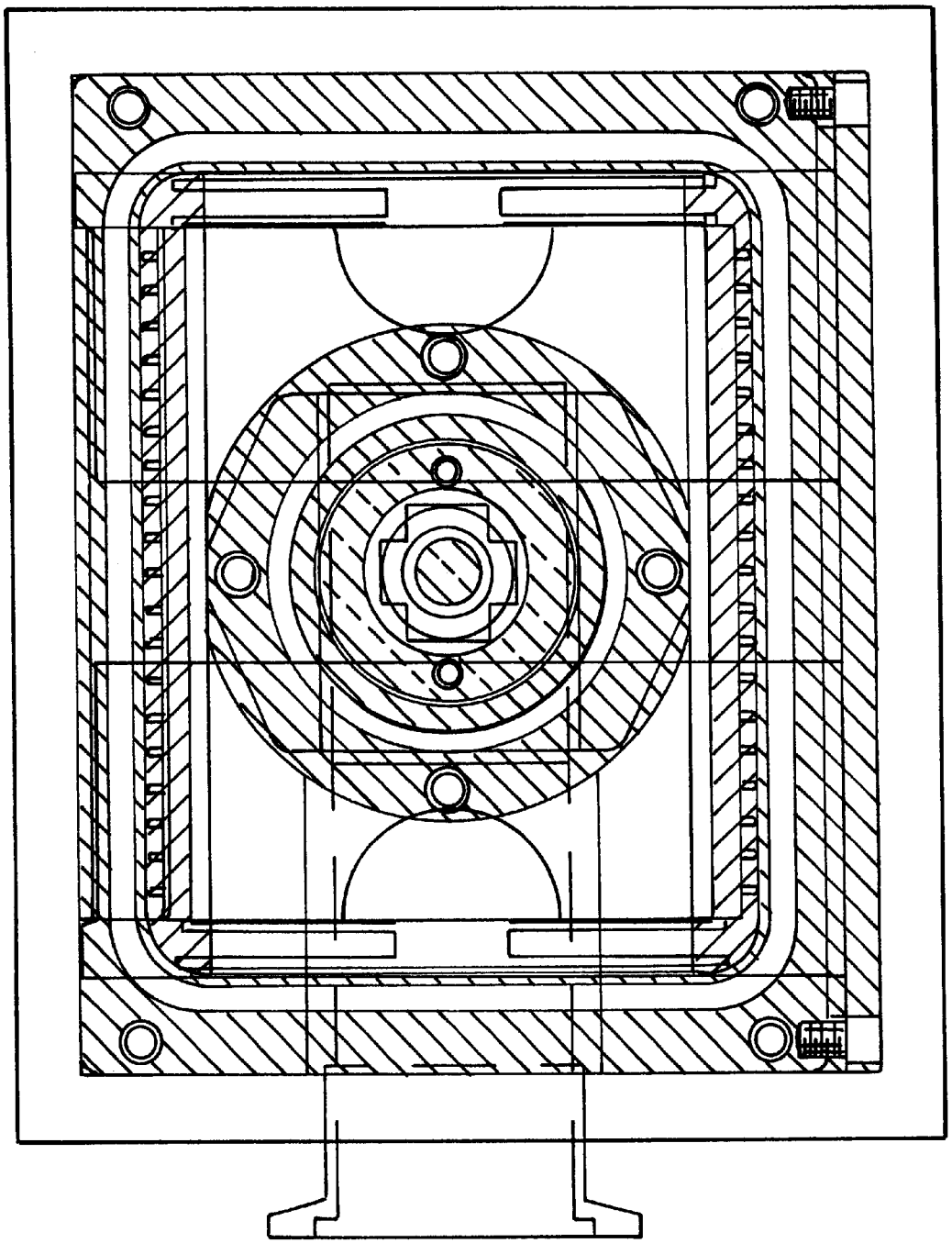
FIG. 2D is a bottom cross-sectional view of the apparatus shown in FIG. 2A.

Parallel electrode array section 52 includes a multiple pairs of cathode and anode electrodes arranged in an interdigitated manner across the volume of section 52 (see FIG. 2C). Cathode electrodes 56 protrude outwardly from opposite surfaces of a center wall 60 that divides collection section 52 into first and second halves. Anode electrodes 54 protrude inwardly from opposite sides of an exterior wall 62. Both anode electrodes 54 and cathode electrodes 56 are aligned essentially parallel to the direction of gas flow through particle collector 40.

Electrodes 54 and 56 as well as center wall 60 and exterior walls 62 are made from machined aluminum. In the currently preferred embodiment, the distance between opposing anode and cathode electrodes is about 1/10 of an inch (100 mils). In other embodiments, more distance is left between the electrodes in order to make the device easier to machine. Those of skill in the art will recognize that electrodes 54 and 56 can be made from other conductive materials and that, rather than machining the electrodes and walls from blocks of metal, the electrodes can be attached to walls 60 and 62 by other appropriate methods.

An electric field is formed between adjacent electrodes in parallel electrode array section 52 to trap electrically charged particles exhausted through the section. In the currently preferred embodiment, the electric field is generated by application of a DC voltage to cathode electrodes 56 while anode electrodes 54 are grounded. Such an arrangement generates a uniform electric field across each gap between adjacent electrodes and confines the powered electrodes to the interior of the device. The generated electric field is designed to maximize particle trapping efficiency, and with this purpose in mind, anode and cathode electrodes 54 and 56 are arranged to increase the charged surface area within section 54 while minimizing gas flow resistance. In a currently preferred embodiment, a relatively small DC power supply is used to supply −200 volts to cathode electrodes 56 through an inner shaft ember 64, which also heats the device as described below.

Labyrinthine section 58 of particle collector 40 includes multiple passages that define a serpentine gas flow path through section 58 as indicated by arrows 66 (see FIG. 2B). The serpentine passages rely primarily on centrifugal force to trap particles too large to be trapped by the electrostatic collector of section 52. To this effect, the multiple, opposite flow paths created in labyrinthine section 58 slows the gas flow through the section resulting in an upstream pressure build-up. The amount of such a pressure build-up is dependent on the arrangement of the passages (i.e., the size and shape of the passages) through section 58 and the amount of gas flow among other factors. In designing a particle collector according to the present invention for a particular process, the amount of this pressure build-up should be taken into account.

In preferred embodiments, the trapping efficiency of labyrinthine section 58 is further increased in that the serpentine passages within section 58 are created by a second parallel electrode array of anode electrodes 68 and cathode electrodes 70. As in upper collection section 52, anode and cathode electrodes 68 and 70 are arranged in an interdigitated manner with cathode electrodes 70 extending outwardly from opposite surfaces of center wall 60 and anode electrodes 68 extending inwardly from opposite sides of exterior wall 62. Electrodes 68 and 70 extend parallel to a plane, however, that is aligned substantially perpendicular to the direction in which electrodes 54 and 56 extend. As shown in FIG. 2A, electrodes 70 are also connected on two sides of the exterior wall by ceramic extenders 69, which block gas flow between electrodes 70 and the external wall and electrically isolate electrodes 70 from the wall.

In a currently preferred embodiment, cathode electrodes 70 are connected to a −200 volt DC power supply through inner shaft member 64 while anode electrodes 70 are grounded. The currently preferred embodiment is also designed for a process that requires a gas flow of 4 liters/min through the vacuum line while, at that flow rate, maintains a pressure build-up between area 58 and the outlet area 48 of the device to be less than or equal to about 3 torr. To accommodate such requirement, opposing electrodes 68 and 70 are maintained about ½ inch from each other and the length of section 58 includes four anode electrodes and three cathode electrodes positioned therebetween.

In some embodiments the interior surfaces of particle collector 40, including cathode electrodes 56 and 70, are heated to facilitate the conversion of rapped particulate matter to gaseous products that may be pumped through the vacuum line. As an example, the present inventors have found that such a heated particle collector is very useful in facilitating the conversion of particles trapped from the silicon nitride deposition process illustrated above. Typically, the trapped particles/powder from such a process is in the form of $Si_3N_4H_x$—a substance that can be converted to $SiF_4$, $N_2$ and $H_2$ in the presence of fluorine from a fluorine clean cycle. The inventors have found that if the interior surfaces of collector 40 are cold (less than 120° C.), the $Si_3N_4H_x$ powder is transformed into $(NH_4)_2SiF_6$, which is a solid powder in the pressure ranges within collector 40 and vacuum line 31. Thus, this newly formed powder can also clog vacuum line 31 and damage vacuum pump 33.

The inventors have found, however, that if the interior surfaces of collector 40 are kept above the sublimation temperature of the trapped $Si_3N_yH_x$, (e.g., above between 120–150° C. depending on the pressure within the collector), the trapped matter is successfully converted to $SiF_4$, $H_2$ and $N_2$ gases. In the currently preferred embodiment it is generally not desirable to heat any portion of the device above 200° C. because trapping efficiency degrades at higher temperatures.

Heating is achieved by way of a heater 64, which includes a stainless steal shaft that extends throughout the majority of length of center wall 60. Wall 60 includes bore through which heater 64 is tightly fitted. The controls to heater 64 are electrically isolated from the DC power supply discussed above. A variety of different heaters can be used in the present invention and the size and shape of the bore in wall 60 can be altered depending on the heater type. In a currently preferred embodiment, heater 64 is a Firerod Cartridge heater (model #J8A71) manufactured by Wattlow Electric Manufacturing Co.

Figure 3:
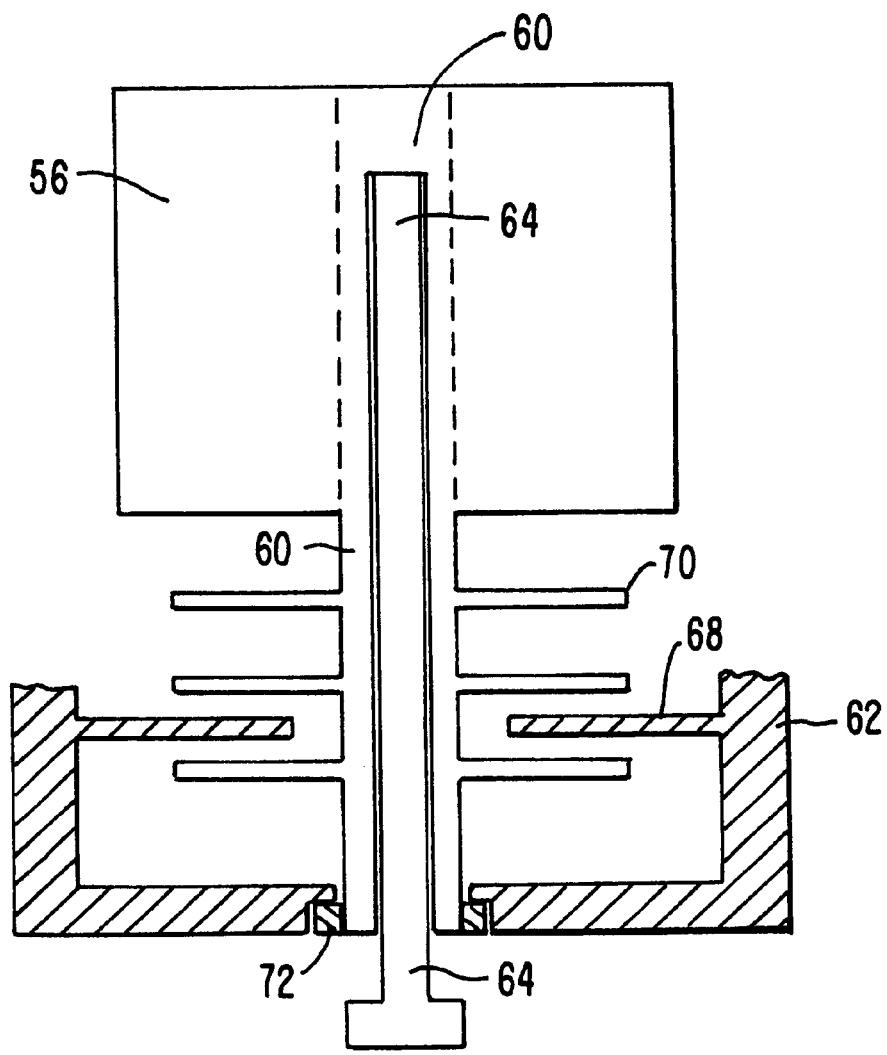
FIG. 3 is a simplified, cross-sectional view of the apparatus shown in FIGS. 2A–2D illustrating the connection of a heater to the apparatus.

A more detailed view of the connection of heater 64 to center wall 60 is shown in FIG. 3, which is a simplified cross-sectional view of selected components of particle collector 40. As shown in FIG. 3, heater 64 extends within a center portion of wall 60. While the fit between heater 64 and wall 60 is designed to be as tight as possible, inevitably there will be small gaps or air pockets between the two members. Generally these gaps will be defined by the limit of mechanical contact in such a fitting. Thus, in order to maximize heat transfer between heater 64 and wall 60, the bore through which heater 64 extends is kept at atmospheric pressure. The temperature gradient between heater 64 and electrodes is approximately 100° C. in this embodiment. Thus, heater 64 is set to 250° C. in order to keep the temperature within collector 40 at 150° C.

Also shown in FIG. 3 is an o-ring 72. O-ring 72 maintains a vacuum seal between an outer wall 74, which is attached to outer wall 62 (from which anode electrodes 54 and 68 are machined to form outlet 48), and center wall 60 (from which cathode electrodes 56 and 70 are machined). To ensure safety standards, heated embodiments of particle collector 40 are wrapped in an insulation material as would be understood by a person of skill in the art. The use of an outer insulation wrapping protects clean room employees from burns due to accidental contact with the particle collector and it helps ensure uniform heating within the particle collector.

One criteria to consider when designing a particle collector 40 for use with a particular substrate processing chamber is the overall size of the collector. Preferably, collector 40 is sized so that it attaches unobtrusively to the substrate processing chamber without taking up additional space in the clean room. The desire to minimize the size of the collector should be balanced with the required collection efficiency of the collector (larger collectors are able to have an increased surface area for particle collection and an increased number of opposite direction gas flow paths than small collectors) and pressure build-up characteristics (described above). The overall dimensions of the embodiment shown in FIGS. 2A–2D is about 6 inches on each side and about 10 inches long. Such a size is particularly well suited for use with a DxZ chamber manufactured by Applied Materials, the assignee of the present invention.

IV. Operation of Particle Collector 40

In operation, gases exhausted from chamber 15 flow into particle collector 40 through inlet 46. From there, the gas flow is directed toward a blocker plate 45 that interrupts the direct flow of gas from inlet 46 and helps disperse the gas throughout the entire cross-sectional area of collection chamber 50. After contacting blocker plate 45, the gas flow is directed through collection section 52 including array of electrodes 54 and 56. The multiple pairs of electrodes 54 and 56 in collection section 52 are aligned parallel to the flow of gas through section 52 in order to minimize gas flow resistance through this section.

As discussed above, the electric field generated between pairs of electrodes 54 and 56 in the array causes smaller, electrically charged particulate matter and powder to be trapped in collection section 52. Gas then flows from collection section 52 into collection section 58 where the gas flow direction is changed from a direct flow through collector 40 to a sinuous flow that includes gas paths in opposite directions that are generally perpendicular to the direct flow through collection section 52.

The sinuous path of the gas flow through collection section 58 creates a particle trap that relies, in part, on centrifugal force and gravity to trap larger particles exhausted through the vacuum line. After flowing through section 58, a substantially particle-free gas flow exits particle collector 40 through outlet 48 into the remaining section of vacuum line 31.

Having fully described several embodiments of the present invention, many other equivalent or alternative devices for and methods of removing particulate matter from a vacuum line according to the present invention will be apparent to those skilled in the art. Additionally, although the present invention has been described in some detail by way of illustration and example for purposes of clarity and understanding, it will be obvious that certain changes and modifications may be practiced. For example, an interdigitated electrode structure can be made without using center wall 60. One manner in which this can be achieved is to have cathode electrodes extend outward from one side (exterior wall) of the particle collector and anode electrodes extend outward from the opposing side (exterior wall). If the exterior walls are made of a conductive metal material and are electrically connected to the electrode fins, the opposing walls must be insulated from each. This can be achieved through the use of a ceramic spacer or similar device that forms a portion of the walls between the opposing walls.

Additionally, the labyrinth portion of labyrinthine section 58 can be made by nonconductive partitions in other embodiments rather than electrodes. It is also possible to include multiple labyrinthal and/or parallel electrode array sections within the fluid conduit providing the pressure drop experienced by a particular implementation is within a manufacturers specified parameters for a particular process. Alternatively, the order in which collection sections 52 and 58 appear in the gas flow path through collector 40 can be reversed. That is, in the embodiment of FIGS. 2A–2D particles enter particle collector 40 and encounter collection section 58 before encountering collection section 52. These equivalents and alternatives along with the understood obvious changes and modifications are intended to be included within the scope of the present invention.

What is claimed is:

1. An apparatus for collecting particles exhausted from a substrate processing chamber, said apparatus comprising:
    a vessel chamber having an inlet, an outlet and a fluid conduit therebetween, said fluid conduit fluidly-coupling said outlet with said inlet and comprising first and second collection sections, said first collection section comprising a first plurality of electrodes aligned parallel to a first plane, said second collection section comprising a first gas passageway defining a path of flow in a first direction for gases passing through said vessel chamber and a second gas passageway defining a flow path in a second direction different than said first direction.

2. The apparatus of claim 1 wherein said second collection section comprises a second plurality of electrodes aligned parallel to a second plane that intersects said first plane and wherein second plurality of electrodes define said first and second gas passages.

3. The apparatus of claim 2 wherein said second plane is substantially perpendicular to said first plane and wherein said first direction is substantially opposite said second direction.

4. The apparatus of claim 2 wherein said first plurality of electrodes comprise a first plurality of anode electrodes and a first plurality of cathode electrodes and wherein said first pluralities of said anode and cathode electrodes are aligned parallel to a length of said vessel chamber.

5. The apparatus of claim 4 wherein said second plurality of electrodes comprises a second plurality of anode electrodes and a second plurality of cathode electrodes, at least some of said second pluralities of anode electrodes and cathode electrodes having opposing surfaces defining a fluid conduit therebetween.

6. The apparatus of claim 2 further comprising a heater operatively coupled to heat said first and second pluralities of electrodes.

7. The apparatus of claim 2 further comprising a voltage source operatively coupled to at least either said first or second pluralities of electrodes to create a voltage between individual ones of said first plurality of electrodes and said second plurality of electrodes.

8. The apparatus of claim 2 further comprising a heater operatively coupled to heat said first and second pluralities of electrodes and a voltage source operatively coupled to at least one of said first or second pluralities of electrodes.

9. The apparatus of claim 2 wherein said first plurality of electrodes include outer electrodes and inner electrodes extending toward each other in an interdigitated manner.

10. The apparatus of claim 9 wherein said outer electrodes fan out from an exterior wall of said fluid conduit and said inner electrodes fan out from an interior surface of said fluid conduit.

11. The apparatus of claim 10 wherein said second plurality of electrodes also includes outer and inner electrodes extending toward each other in an interdigitated manner, said outer electrodes fanning out from an exterior wall of said fluid conduit and said inner electrodes fanning out from an interior surface of said fluid conduit.

12. The apparatus of claim 11 wherein said outer electrodes of said first electrode plurality are electrically coupled to said outer electrodes of said second electrode plurality and wherein said inner electrodes of said first electrode plurality are electrically coupled to said inner electrodes of said second electrode plurality.

13. The apparatus of claim 12 wherein said outer electrodes are grounded and wherein said inner electrodes are coupled to a voltage source.

14. The apparatus of claim 2 wherein said first plurality of electrodes are aligned substantially parallel to the flow of fluid through said fluid conduit and wherein said second plurality of electrodes are aligned substantially perpendicular to the flow of fluid through said fluid conduit.

15. The apparatus of claim 1 wherein said vessel chamber is arranged so that gas flowing into said chamber flows, in order, through said inlet, said first section, said second section and then said outlet.

16. The apparatus of claim 1 wherein said vessel chamber is arranged so that gas flowing into said chamber flows, in order, through said inlet, said second section, said first section, and then said outlet.

17. An apparatus for collecting particles exhausted from a substrate processing chamber, said apparatus comprising:
    a vessel chamber having an inlet, an outlet and a fluid conduit therebetween, said fluid conduit fluidly-coupling said outlet with said inlet and comprising first and second collection sections, said first collection section comprising a first plurality of electrodes aligned substantially parallel to a first plane, said first plurality of electrodes including pluralities of anode electrodes and cathode electrodes arranged in an interdigitated manner, said second collection section comprising a second plurality of electrodes aligned substantially perpendicular to said first plane, said second plurality of electrodes including pluralities of anode electrodes and cathode electrodes arranged so that opposing surfaces of each define a labyrinthal flow path to inhibit egress of particulate matter from the fluid conduit.

18. The apparatus of claim 17 wherein said anode electrodes of said first and second pluralities of electrodes extend from an exterior wall defining said fluid conduit.

19. The apparatus of claim 17 wherein said cathode electrodes of said first and second pluralities of electrodes are electrically coupled to interior shaft extending through a center portion of said fluid conduit.

20. The apparatus of claim 17 wherein said vessel chamber is arranged so that gas flowing into said chamber flows, in order, through said inlet, said first section, said second section, and then said outlet.

21. The apparatus of claim 17 wherein said vessel chamber is arranged so that gas flowing into said chamber flows, in order, through said inlet, said second section, said first section, and then said outlet.

22. An apparatus for collecting particles exhausted from a substrate processing chamber, said apparatus comprising:
    a vessel chamber having an inlet, an outlet and a fluid conduit therebetween, said fluid conduit fluidly-coupling said outlet with said inlet and comprising first and second collection sections, said first collection section comprising a plurality of anode and cathode electrodes arranged substantially parallel to a flow of gases through said first collection section, said second collection section comprising a serpentine fluid path.

23. The apparatus of claim 22 wherein said second collection section comprises a plurality of anode and cathode electrodes that define said serpentine fluid path.

24. The apparatus of claim 22 wherein said vessel chamber is arranged so that gas flowing into said chamber flows, in order, through said inlet, said first section, said second section, and then said outlet.

25. The apparatus of claim 22 wherein said vessel chamber is arranged so that gas flowing into said chamber flows, in order, through said inlet, said second section, said first section, and then said outlet.

* * * * *